(12) United States Patent
Papasouliotis et al.

(10) Patent No.: US 6,794,290 B1
(45) Date of Patent: Sep. 21, 2004

(54) METHOD OF CHEMICAL MODIFICATION OF STRUCTURE TOPOGRAPHY

(75) Inventors: George D. Papasouliotis, Cupertino, CA (US); Robert D. Tas, Morgan Hill, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/004,386

(22) Filed: Dec. 3, 2001

(51) Int. Cl.[7] .............................................. H01L 21/311
(52) U.S. Cl. ..................................................... 438/694
(58) Field of Search ................................ 438/637, 692, 438/732, 733, 787, 788, 434, 435, 759, 694, 695–699

(56) References Cited

U.S. PATENT DOCUMENTS

| | | | |
|---|---|---|---|
| 4,361,461 A | * 11/1982 | Chang | 438/710 |
| 5,227,191 A | 7/1993 | Nagashima | |
| 5,246,885 A | 9/1993 | Braren et al. | |
| 5,270,264 A | 12/1993 | Andideh et al. | |
| 5,282,925 A | 2/1994 | Jeng et al. | |
| 5,342,801 A | * 8/1994 | Perry et al. | 438/588 |
| 5,385,857 A | * 1/1995 | Solo de Zaldivar | 438/253 |
| 5,494,854 A | 2/1996 | Jain | |
| 5,532,516 A | 7/1996 | Pasch et al. | |
| 5,621,241 A | 4/1997 | Jain | |

(List continued on next page.)

OTHER PUBLICATIONS

Wolf, S. "Silicon Processing for the VLSI Era–vol. 1" Lattice Press, Sunset Beach, CA 1987, pp. 349–353 and 539–552.*

Cote et al., "Low–Temperature Chemical Vapor Deposition Processes and Dielectric for Microelectric Circuit Manufacturing at IBM," *IBM Journal of Research and Development*, vol. 39, No. 4 (Jul. 1995), pp. 437–464.

Pennington et al., "An Improved Interlevel Dielectric Process for Submicron Double–Level Metal Products," *Proceedings of the 6th International IEEE VLSI Multilevel Interconnection Conference*, (Jun. 1989), pp. 355–359.

*Primary Examiner*—Craig A. Thompson
(74) *Attorney, Agent, or Firm*—MacPherson Kwok Chen & Heid LLP; Tom Chen

(57) ABSTRACT

A method is provided for filling high aspect ratio gaps without void formation by using a high density plasma (HDP) deposition process with a sequence of deposition and hydrogen etch steps. The first step uses an etch/dep ratio less than one to quickly fill the gap. The first step is interrupted before the opening to the gap is closed. The second step uses a hydrogen-based plasma to chemically etch the deposited material to widen the gap. The second step is stopped before corners of the elements forming the gaps are exposed. These steps can be repeated until the aspect ratio of the gap is reduced so that void-free gap-fill is possible. The etch/dep ratio and duration of each step can be optimized for high throughput and high aspect ratio gap-fill capacity.

32 Claims, 6 Drawing Sheets

U.S. PATENT DOCUMENTS

| | | |
|---|---|---|
| 5,622,894 A | 4/1997 | Jang et al. |
| 5,636,320 A | 6/1997 | Yu et al. |
| 5,641,545 A | 6/1997 | Sandhu |
| 5,702,982 A | 12/1997 | Lee et al. |
| 5,705,419 A * | 1/1998 | Perry et al. ............. 438/588 |
| 5,789,818 A | 8/1998 | Havemann |
| 5,851,344 A | 12/1998 | Xu et al. |
| 5,858,876 A | 1/1999 | Chew |
| 5,869,902 A | 2/1999 | Lee et al. |
| 5,872,058 A * | 2/1999 | Van Cleemput et al. .... 438/692 |
| 5,897,370 A | 4/1999 | Joshi et al. |
| 5,910,020 A | 6/1999 | Yamada |
| 5,911,113 A | 6/1999 | Yao et al. |
| 5,913,140 A | 6/1999 | Roche et al. |
| 5,920,792 A | 7/1999 | Lin |
| 5,937,323 A | 8/1999 | Orczyk et al. |
| 5,953,635 A | 9/1999 | Andideh |
| 5,962,923 A | 10/1999 | Xu et al. |
| 5,963,840 A | 10/1999 | Xia et al. |
| 5,968,610 A | 10/1999 | Liu et al. |
| 5,972,192 A | 10/1999 | Dubin et al. |
| 6,027,663 A * | 2/2000 | Martin et al. ............. 216/66 |
| 6,030,881 A * | 2/2000 | Papasouliotis et al. ...... 438/424 |
| 6,077,451 A | 6/2000 | Takenaka et al. |
| 6,331,494 B1 | 12/2001 | Olson et al. |
| 6,335,261 B1 | 1/2002 | Natzle et al. |
| 6,395,150 B1 | 5/2002 | Van Cleemput et al. |

* cited by examiner

METHOD OF CHEMICAL MODIFICATION OF STRUCTURE TOPOGRAPHY

BACKGROUND OF THE INVENTION

1. Field of the Invention

The present invention relates generally to methods of thin film deposition and, more specifically, to a method of minimizing structure overhang during the process of filling high aspect ratio gaps on substrates.

2. Background of the Invention

As semiconductor technology advances, circuit elements and interconnections on wafers or silicon substrates become increasingly more dense. In order to prevent unwanted interactions between these circuit elements, insulator-filled gaps or trenches located therebetween are provided to physically and electrically isolate the elements and conductive lines. However, as circuit densities continue to increase, the widths of these gaps decrease, thereby increasing gap aspect ratios, typically defined as the gap height divided by the gap width. As a result, filling these narrower gaps becomes more difficult, which can lead to unwanted voids and discontinuities in the insulating or gap-fill material.

In previous generations of microelectronic devices the gaps between metal lines were filled using either PECVD (plasma enhanced chemical vapor deposition) processes or the combinations of those with sputter etch steps. For example, U.S. Pat. No. 5,270,264 to Andideh et al. describes a gap-filling process which involves the steps of deposition by PECVD, followed by argon sputter etching, followed by another PECVD deposition step, i.e., a PECVD "dep-etch-dep" process. The article by S. Pennington et al. (hereinafter "the article by Pennington et al."), entitled "An Improved Interlevel Dielectric Process for Submicron Double-Level Metal Products," in *Proceedings of the 6$^{th}$ International IEEE VLSI Multilevel Interconnection Conference*, (1989), pp. 355–359, describes a dielectric gap-filling process using both PECVD and thermal CVD (THCVD). The article by D. Cote et al. (hereinafter "the article by Cote et al."), entitled "Low-Temperature Chemical Vapor Deposition Processes and Dielectrics for Microelectronic Circuit Manufacturing at IBM", in the *IBM Journal of Research and Development*, vol. 39, no. 4, (July 1995), pp. 437–464, describes several known CVD processes, including low pressure (LP), atmospheric pressure (AP) CVD, and plasma-enhanced (PE) CVD, which are background to the present invention. However, the gap-fill capabilities of such processes or combinations of processes do not extend beyond aspect ratios of 1.3:1 at spacing 0.45 $\mu$m or 4500 Å, even when "dep-etch-dep" cycles are performed, as described in U.S. Pat. No. 5,270,264 and the article by Cote et al. Specifically, the article by Cote et al. refers to and presents data demonstrating the inability of PECVD processes to satisfy the gap-fill requirements of advanced microelectronic devices with either undoped or doped silica glass.

In the gap-fill process described in U.S. Pat. No. 5,270,264, a step of deposition by PECVD is followed by a sputter etch step with argon and another step of deposition by PECVD. As understood by those skilled in the art, deposition by PECVD is strictly a deposition step, i.e., not involving simultaneous etching during exposure to the depositing plasma. U.S. Pat. No. 5,270,264 describes a gap-filling process which performs a sputter etch using inert gases of heavy atomic weight such as Ar, Kr, and Xe. The process parameters for the PECVD deposition and etching are specified in that patent for the plasma power density and pressure. In addition, the capabilities of the dep-etch-dep processes described in the articles by Pennington et al., by Cote et al., and U.S. Pat. No. 5,270,264 are limited by virtue of the use of PECVD deposition, the selection of sputter gases described therein, and the process parameters defined for the sputter etch step. As a result, the processes described in these references cannot be used to fill gaps having aspect ratios greater than about 2:1 and width less than about 0.65 $\mu$m (6500 Å).

High density plasma (HDP) chemical vapor deposition (CVD) processes are currently used to fill gaps having aspect ratios of about 3:1 and having close spacing, e.g. about 0.25 $\mu$m. HDP processes operate at a pressure regime several (e.g., two to three) orders of magnitude lower than that of their PECVD counterparts. Moreover, in an HDP reactor, power is coupled inductively to the plasma, resulting in higher plasma density. Consequently, in an HDP reactor, because of the pressure and plasma characteristics, the species impinging on the depositing film surface are much more energetic than in a PECVD reactor, such that gas-solid collisions may result in sputtering of the deposited film. In an HDP CVD deposition process, the sputter etch component is typically between 10% and 20% of the net deposition rate. Another characteristic of HDP deposition is that increased bias power applied to the wafer results in an increased in-situ sputter etch component, thereby decreasing the deposition rate.

By contrast, in PECVD reactors the coupling is capacitive, resulting in much lower plasma density. The combination of low plasma density and high pressure results in negligible film sputtering in PECVD deposition. In addition, those skilled in the art will understand that the rate of film deposition in PECVD processes may increase with the amount of bias power applied to the wafer.

The differences in the physics and chemistry of PECVD and HDP processes result in significant differences in the growth of the deposited film. In PECVD processes, plasma is used to generate deposition precursors, which in turn, are driven to the wafer surface by applied bias to the wafer. Because of the relatively high pressure of operation (on the order of 1 Torr), the ions experience a large number of collisions as they cross the sheath. As a result, the flux of deposition precursor species to the wafer surface is distributed. Moreover, the mixture is depleted of deposition precursors as it diffuses towards the bottom of the trench, and, as a result, the net rate of film growth at the bottom of the trench is smaller than that at the entry region of the trench. Therefore, void-free filling of gaps having high aspect ratios (i.e., aspect ratios approaching or exceeding 2:1 at 0.65 $\mu$m spacing) cannot be achieved using PECVD methods since the opening to the gap will be closed long before the gap is filled. For these reasons, the process sequence described in U.S. Pat. No. 5,270,264 of PECVD deposition, argon sputter etch, followed by another PECVD deposition, cannot provide void-free filling of high aspect ratio gaps at current microelectronic dimensions.

Existing HDP deposition processes typically employ chemical vapor deposition (CVD) with a gas mixture containing oxygen, silane, and inert gases, such as argon, to achieve simultaneous dielectric etching and deposition. In an HDP process, RF bias is applied to a wafer substrate in a reaction chamber. As a result, the flux of deposition precursors is perpendicular to the wafer, and the net film growth occurs perpendicularly to the bottom of the feature. Some of the gas molecules (particularly argon) are ionized in the plasma and accelerate toward the wafer surface when the RF bias is applied to the substrate. Material is thereby sputtered when the ions strike the surface. As a result, dielectric material deposited on the wafer surface is simultaneously sputter-etched to help keep gaps open during the deposition process, which allows higher aspect ratio gaps to be filled.

FIGS. 1A–1D illustrate, in more detail, the simultaneous etch and deposition (etch-dep) process described above. In FIG. 1A, a gas mixture of silane ($SiH_4$), oxygen ($O_2$), and an inert gas such as argon (Ar) begins depositing $SiO_2$ on the surface of a wafer 100 for filling a gap 110 between circuit elements 120. As $SiO_2$, formed from the $SiH_4$ and $O_2$, is being deposited, charged Ar and other charged ions impinge on the $SiO_2$ or dielectric layer 125, thereby simultaneously etching the $SiO_2$ layer. However, because the etch rate at about 45° is approximately three to four times that on the horizontal surface, approximately 45° facets 130 form at the corners of elements 120 during the deposition process, as shown in FIG. 1B. FIGS. 1C and 1D show the process continuing to fill gap 110 with simultaneous etching and deposition of $SiO_2$.

In FIGS. 1A–1D, the etch/dep ratio, defined as the ratio of etch rate to deposition rate, is optimized such that facets 130 remain at the corners of circuit elements 120 throughout the HDP deposition process. However, as shown in FIG. 2A, if the etch/dep ratio is decreased, facets 130 begin moving away from the corners of elements 120, and cusps 210 begin to form around the entry or opening of gap 110. Cusp formation is due in part to some of the etched $SiO_2$ being redeposited on opposing surfaces through line-of-sight redeposition, even though most of the etched $SiO_2$ is emitted back into the plasma and pumped out of the reaction chamber. This redeposition increases as the distance between opposing surfaces decreases. Therefore, as facets 130 move away from the corners of elements 120, the line-of-sight paths are shortened, resulting in increased sidewall redeposition. At a certain point in the process, cusps 210 will meet and prevent further deposition below the cusps. When this occurs, a void 220 is created in dielectric layer 125, as shown in FIG. 2B. Thus, cusp formation creates reentrant features, i.e., the width at the entry to the gap is smaller than the width at the bottom of the gap, which makes void-free gap-filling harder to achieve. The likelihood of creating voids is increased when elements 120 are reentrant before the gap-fill process begins.

On the other hand, if the etch/dep ratio is increased, as shown in FIG. 3, the etching component can etch or "clip" material from the corners of elements 120, thereby damaging elements 120 and introducing etched contaminants 310 into dielectric layer 125.

By optimizing the etch/dep ratio, gaps with aspect ratios of up to about 4:1 and widths as low as 0.15 μm can be filled without voids. However, as shown in FIG. 4, filling higher aspect ratio gaps and/or narrower widths results in voids 410 due to cusps 420 prematurely closing the gaps even if the etch/dep ratio is optimized. As discussed above, this is due mainly to the shortened line-of-sight path between opposing sidewalls. Cusp formation at the entry region of high aspect ratio gaps and narrow widths to be filled cannot be totally eliminated because sputtering and redeposition reactions are inherent to the physics and chemistry of the HDP CVD process. If the etch rate is increased to keep the gaps open longer, undesirable corner clipping can occur.

Therefore, with circuit densities increasing, a method is desired to fill higher aspect ratio gaps with narrow widths and gaps between reentrant elements without the problems discussed above with current HDP deposition processes.

SUMMARY OF THE INVENTION

In accordance with the present invention, a high aspect ratio gap-fill process uses a high density plasma (HDP) deposition process with a sequence of deposition and etching steps, where the etching steps utilize hydrogen ($H_2$) to chemically etch the deposited material.

In one embodiment, gap-fill material, such as silicon dioxide, is deposited in a gap with a deposition process in a first step of the HDP process. Before the entry to the gap closes, the deposition step is interrupted to prevent void formation within the gap. In the next step, the overhang or cusp is removed by chemical etching using $H_2$ (i.e., in a hydrogen-based plasma). The etching can be performed on an unbiased and unclamped wafer, in which case argon (Ar) gas can also be used, or with a bias HF power applied in which Ar is not used. Before the corners of the elements forming the gap are exposed from the etch step, the etch step is stopped to prevent corner clipping. Since the thickness of the material deposited at the entry region of the gap is lower than that at the bottom of the gap, the aspect ratio of the gap at the end of a deposition/etching cycle (deposition step followed by an etch step) is typically lower than the initial or previous aspect ratio. The deposition and etch steps can be repeated until the resulting aspect ratio is low enough to allow void-free gap-fill with a deposition step or a normal HDP CVD process. In principle, the overall process consists of 2n+1 steps, where n is a positive integer.

The etching steps utilize hydrogen. However, because hydrogen is an ineffective sputtering gas (i.e., due in part to its low weight), the etching is primarily due to a chemical reaction ($SiO_2+2H_2 \rightarrow SiH_4+O_2$). The etch rate increases with the LF power (or wafer temperature). Etching using this chemical reaction allows accurate control of the etch rate (due in part to a much lower etch rate than with conventional fluorine-based etch processes), a clean etching process (with no solid residual material), and high degrees of repeatability.

Throughput is also increased because the entire gap-fill process is performed in a single process chamber, instead of separate deposition and etch chambers. Etch/dep ratio is varied and transitions from deposition to etching steps are effected by changing the gas mixture chemical composition, the power supplied to the reactor, the chamber pressure, and/or the wafer temperature.

Accordingly, this invention accomplishes void-free gap-fill for gaps having high aspect ratios (>3.5:1) and small openings (<0.13 μm) through use of a composite multi-step HDP-CVD process using hydrogen in a chemical etch process.

This invention will be more fully understood in light of the following detailed description taken together with the accompanying drawings.

BRIEF DESCRIPTION OF THE DRAWINGS

Use of the same reference numbers in different figures indicates similar or like elements.

DETAILED DESCRIPTION

The present invention provides a high density plasma (HDP) process using multiple sequential deposition and etch steps to fill high aspect ratio gaps, where the etch steps utilize hydrogen ($H_2$) to chemically etch the deposited material. Steps with etch/dep ratios less than one (referred to hereinafter as deposition steps) are used to primarily fill the gaps, while etch steps using $H_2$ are used to primarily open up the entries to the gaps.

The following description illustrates the use of undoped silicon oxide (USG) in filling structures of high aspect ratio (>3.5:1) and width smaller than 0.13 μm. The shallow trench isolation (STI) step is one example for which the method of the present invention can be implemented. However, the method of the present invention can also be used in other steps in the production of integrated circuits where films are deposited, such as pre-metal dielectric (PMD) and intermetal dielectric (IMD) films. Depending on the production step, the deposited film can be USG, phosphorus-doped oxide (PSG), fluorine-doped oxide (FSG), boron-doped oxide (BSG), boron/phosphorus doped oxide (BPSG), and silicon-oxycarbide (SiCOH). Those skilled in the art will thus appreciate that the use of dopant sources, such as, but not limited to, phosphine ($PH_3$), silicon tetrafluoride ($SiF_4$), and organosilicon compounds, for deposition of these other films is within the scope of this invention. Note that these compounds are given as examples. The scope of this invention is not material-specific, but it encompasses any material which can be deposited and etched.

Figure 5A:
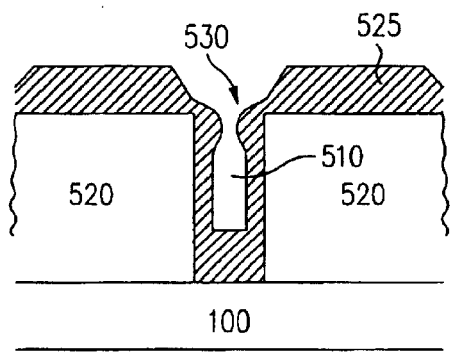
FIGS. 5A–5C are sequential views of high aspect ratio gaps filled with the method of the present invention.
Figure 5B:
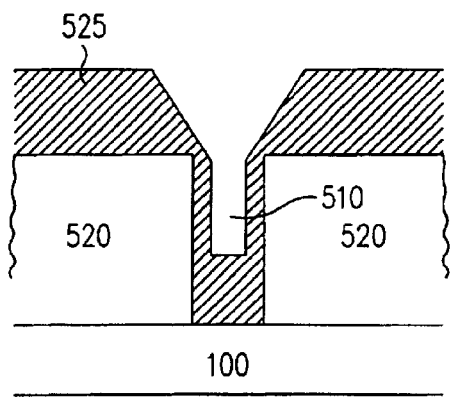
Figure 5C:
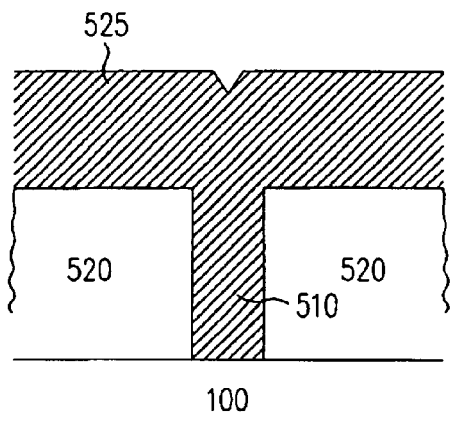

FIGS. 5A–5C show the steps for one embodiment of the present invention for filling a high aspect ratio gap with a $SiO_2$ or dielectric layer 525. In FIG. 5A, high aspect ratio gaps 510 (i.e., typically having aspect ratios greater than 3.5:1) are formed between circuit elements 520 on a substrate or wafer 100. Circuit elements 520 can include, for example, transistors, conductors, or interconnects. Gap 510 is filled using an HDP process having an etch/dep ratio less than one. Cusps 530 begin to form at the corners of circuit elements 520 as $SiO_2$ layer 525 fills gap 510, as shown in FIG. 5A. Before cusps 530 close the entry to gap 510, the deposition step is stopped. Preferably, the deposition step is stopped before the entry to gap 510 closes. After this initial deposition step, gap 510 is partially filled and partially closed.

In FIG. 5B, the next step of the HDP process uses an chemical etch step with hydrogen to widen the entry to gap 510. The etch step removes the cusp material 530 and, as a result, the entry to gap 510 is widened. Before the corners of elements 520 are exposed, the etch step is stopped to prevent clipping. Since the thickness of the material deposited at the entry region of the gap is lower than that at the bottom of the gap, the aspect ratio of the gap at the end of the deposition/etching cycle (a deposition step followed by an etch step) is lower than the initial or previous aspect ratio of the feature. The deposition/etching cycle is repeated as many times as necessary until the resulting gap can be filled by a conventional HDP deposition step (FIG. 5A) without void formation, as shown in FIG. 5C. The material deposited during different deposition steps need not be necessarily the same. Deposition of composite structures, including, but not limited to USG/PSG/USG or USG/FSG/USG, in which the overall layer consists of segments having different chemical composition, is within the scope of this invention.

Factors dictating the optimum etch/dep ratio of each deposition step include the aspect ratio of the gaps and the size of the gap openings prior to each deposition step. Data from simulations and experiments can be used to maximize gap-fill process efficiency by varying the etch/dep ratio and deposition step duration according to specific wafer parameters prior to each deposition step. Methods to vary the etch/dep ratio are well-known in the art and include changing the chemical composition of the reactive gas mixture, the power supplied to the wafer, the pressure of the process chamber, and the temperature of the wafer. For example, increasing the HF power to the wafer, reducing the amount of silane in the gas mixture, and increasing the temperature of the wafer are some ways to increase the etch/dep ratio.

Table 1 provides typical process parameter ranges for a deposition step to fill a high aspect ratio gap with undoped silica glass. The gas mixture comprises oxygen and silane, and in some embodiments, also an inert gas, such as Ar or He. Low frequency power (LF) requirements range from 2 kW to 10 kW, and high frequency (HF) (bias) power ranges from 0.5 kW to 10 kW, dependent upon the wafer size (200 or 300 mm diameter) and the process being used. The deposition step can be performed in conventional HDP CVD reactors, such as the standard HDP chamber (SPEED) of Novellus Systems, Inc. of San Jose, Calif. For example, in the Novellus reactor, LF power is applied to the dome of the reactor to create the background plasma, and HF power is applied to the electrostatic chuck (ESC) to attract ionized molecules in the plasma toward the wafer surface for sputtering.

TABLE 1

| PROCESS PARAMETER | RANGE |
| --- | --- |
| Low Frequency Power (kW) | 2–20 |
| High Frequency Power (kW) | 0.5–10 |
| Chamber Pressure (mTorr) | 1.5–25 |
| Deposition Step Duration (s) | 5–500 |
| Oxygen Flow Rate (sccm) | 10–1000 |
| Inert Gas Flow Rate (sccm) | 0–1000 |
| Silane Flow Rate (sccm) | 10–250 |

Note that the inclusion of other carrier and/or reactant gases in the mixture during the USG deposition is within the scope of this invention.

The etch rate and duration of the $H_2$ etch steps is optimized based on the geometry of the structure and the topography of the cusp or overhang. The duration of the etch steps is determined by the rate of material removal. Data from simulations and experiments on both monitor (flat) and structured wafers can be used to optimize the etch step duration for each etch step in a gap-fill process.

Table 2 provides typical process parameter ranges during an etch step using hydrogen for undoped silica glass deposition. The reactive mixture will provide a non-fully directional etch in order to remove material from the side-walls of the trench and the field area. Unlike the conventional oxide etch steps described in the articles by Cote et al., Pennington et al., and U.S. Pat. No. 5,270,264, the present invention relies on chemical, i.e., isotropic, etch by hydrogen to remove material from the side-walls and the entry region of the trench. Better process control is achieved through lower etching rates (discussed in more detail below). During the etch steps, the LF power varies from 1–20 kW and the HF power varies from 0–5 kW, depending on wafer size (e.g., 200 or 300 mm diameter) and the specific process requirements.

TABLE 2

| PROCESS PARAMETER | RANGE |
| --- | --- |
| Low Frequency Power (kW) | 1–20 |
| High Frequency Power (kW) | 0–5 |
| He Backside Pressure (Torr) | 0–12 |
| Chamber Pressure (mTorr) | 5–500 |
| Etch Step Duration (s) | 5–1700 |
| Oxygen Flow Rate (sccm) | 0–500 |
| Hydrogen Flow Rate (sccm) | 100–5000 |
| Argon Flow Rate (sccm) | 0–200 |

Because hydrogen is a very low weight gas, it is ineffective as a sputtering agent, such as compared with argon. However, the use of hydrogen during the etch step is not for a physical etch, but for a chemical etch. The energy needed for the chemical reaction is provided by the plasma. The chemical reaction is given by the following:

$$SiO_2 + 2H_2 \rightarrow SiH_4 + O_2$$

As seen, the hydrogen reacts with the deposited silicon oxide to create silane and oxygen, which is the reverse of the reaction to deposit the silicon oxide from a silane and oxygen reaction. Thus, the deposited silicon oxide is etched away chemically, with only silane and oxygen as by-products. However, the chemical etch rate is much slower than conventional etch processes, such as fluorine-based etches. For example, fluorine-based etch processes can etch at rates greater than 1 kÅ/min, while in the case of a hydrogen-based chemical etch, the rate can be controlled to the order of 100 Å/min. This slow etch rate provides the advantage of being able to accurately control the etch rate during the etch steps.

The hydrogen etch of the present invention does not exhibit loading and process drift effects between wafers, as is common with fluorine-based etch processes, thereby allowing high repeatability between applications. Additionally, use of $H_2$ for etching the overhang prevents the incorporation of dopants/impurities (such as fluorine) into the film, thus improving its properties and performance.

Figure 6:
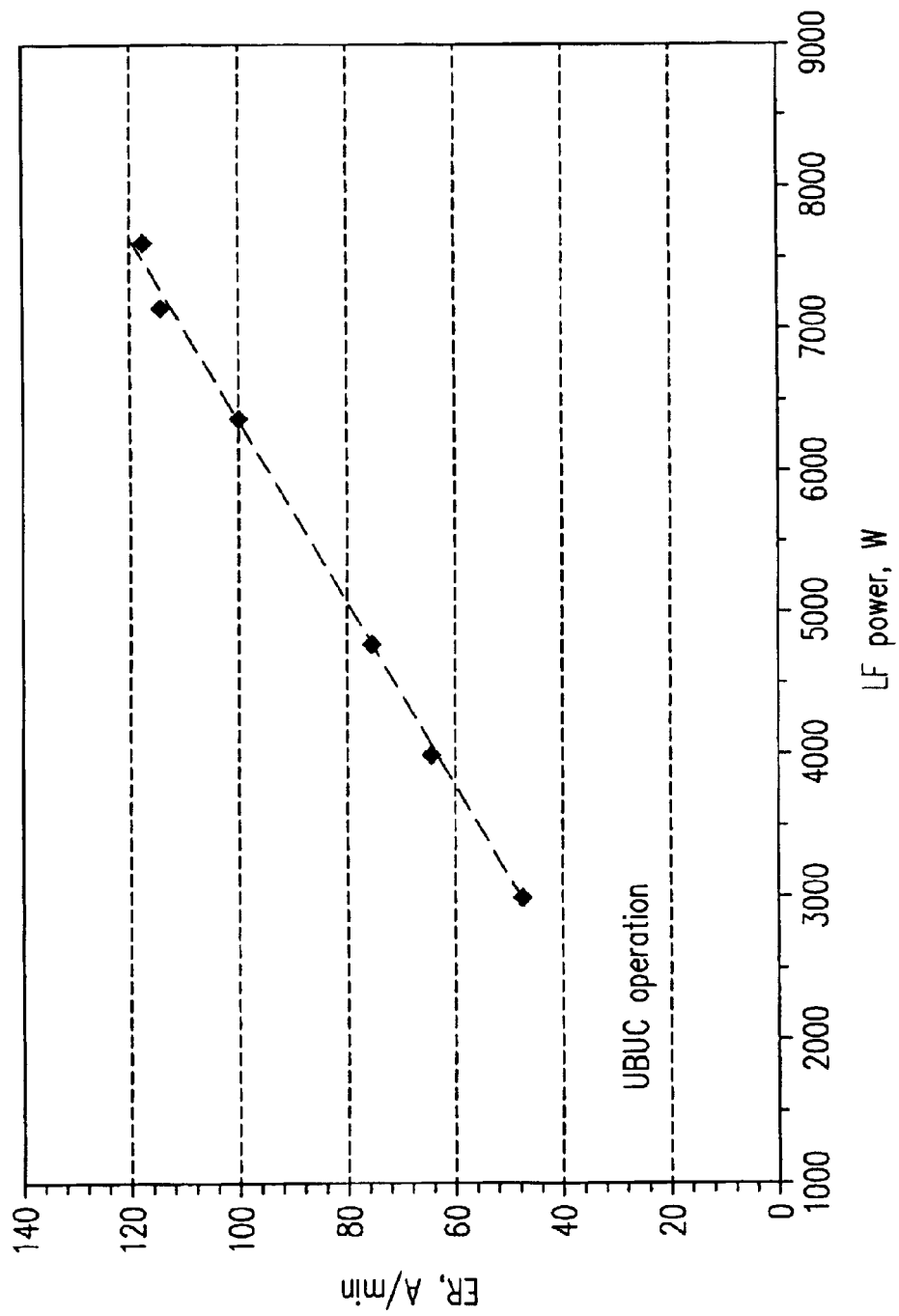
FIG. 6 is a graph showing the dependence of etch rate on LF power.
Figure 7:
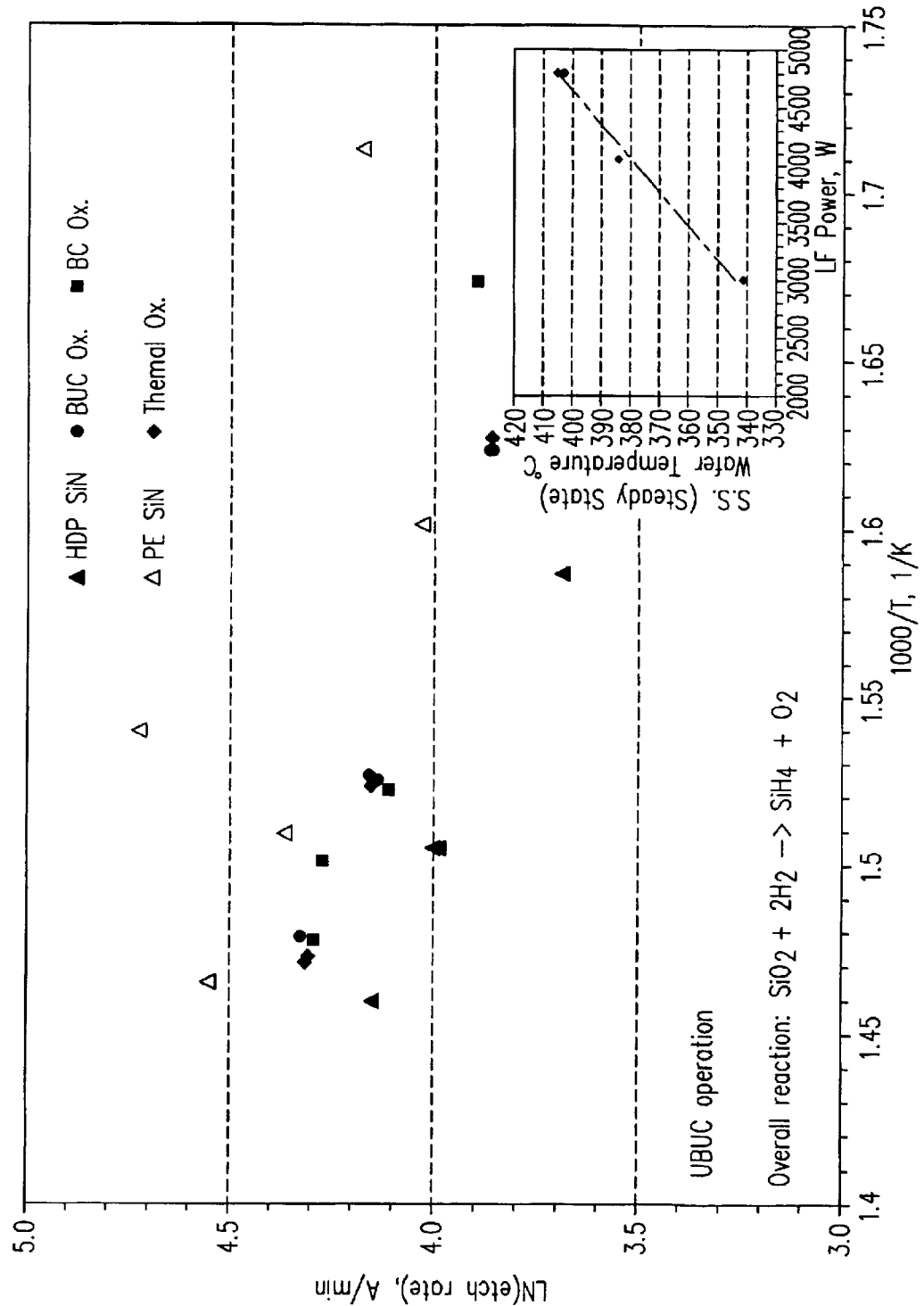
FIG. 7 is a graph showing the dependence of etch rate on LF power and wafer temperature for different dielectric materials.
Figure 8:
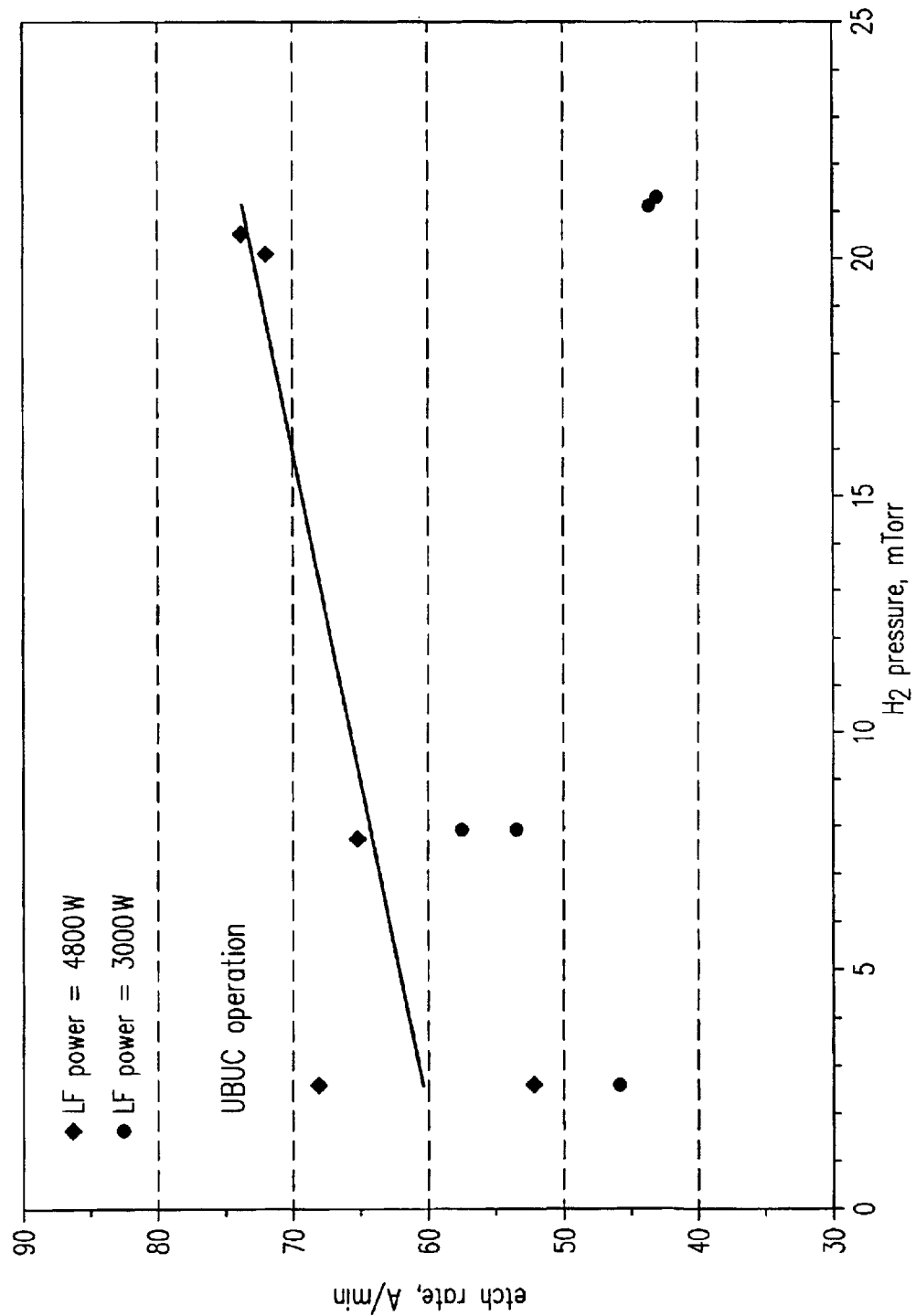
FIG. 8 is a graph showing the dependence of etch rate on hydrogen pressure for different LF power levels.

The etch rate for an etch step can be varied or optimized by changing different process parameters. FIGS. 6–8 are plots showing etch rate dependence on various parameters. FIGS. 6–8 are for an unbiased, unclamped wafer. FIG. 6 shows the dependence of etch rate on the LF power. As seen, as the LF power increases, the etch rate increases (approximately linearly from 45 Å/min to 120 Å/min). In FIG. 7, the larger plot shows the natural log (ln) of the etch rate as a function of temperature (inverse) for different types of oxides. As temperature increases (from right to left), the etch rate increases. The smaller plot at the lower left hand portion shows wafer temperature as a function of LF power. This shows that as LF power increases, the wafer temperature increases. Consequently, etch rates using $H_2$ can be increased by increasing the LF power or temperature. This is also shown in FIG. 8. Further, in FIG. 8, the etch rate is shown as a function of $H_2$ pressure for different LF powers. In general, the higher the $H_2$ pressure, the higher the etch rate.

Figure 1A:
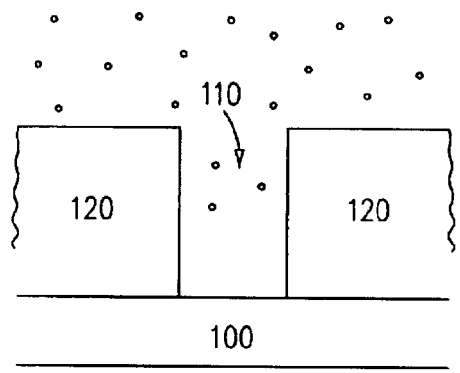
FIGS. 1A–1D are sequential views of a conventional HDP deposition process with optimized etch/dep ratios.
Figure 1B:
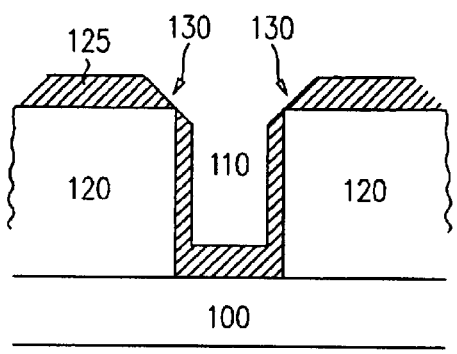
Figure 1C:
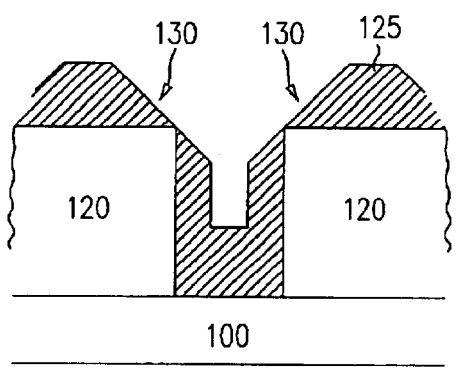
Figure 1D:
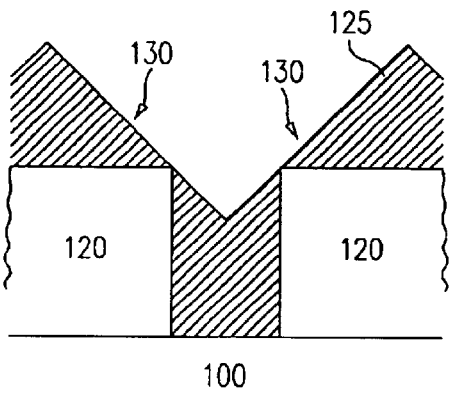
Figure 2A:
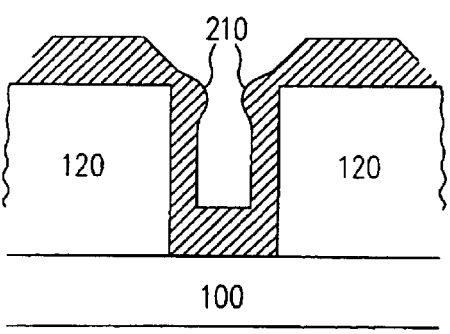
FIGS. 2A–2B are sequential views illustrating void formation when the etch/dep ratio decreases using a conventional HDP process.
Figure 2B:
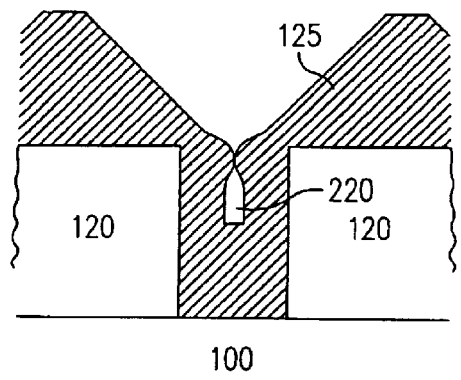
Figure 3:
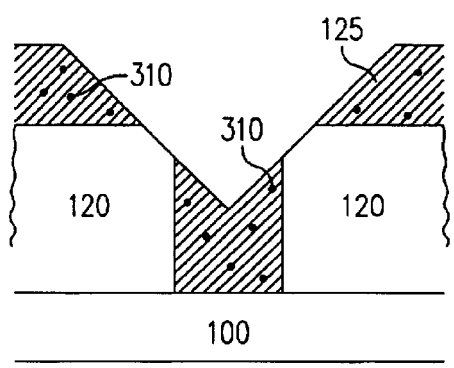
FIG. 3 is a picture of "clipped" corners when the etch/dep ratio increases using conventional HDP processes.
Figure 4:
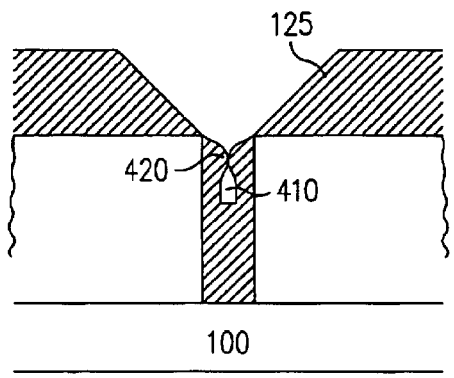
FIG. 4 is a picture of void formation when filling a high aspect ratio gap using a conventional HDP process.

Optimum process results are obtained when the etching is not fully directional, i.e., etching does not occur only in the vertical direction as in the processes described in the articles by Cote et al., Pennington et al., and U.S. Pat. No. 5,270,264. Fully directional etching is undesirable because the process of removing cusps from the gap opening can result in the erosion of features which are located at the corners of the gaps to be filled, i.e., "corner clipping." For example, in FIG. 2A, in order to remove cusps 210, the etch step, if fully directional, would have to remove an amount of material equal to the vertical height of the cusps. However, the etch step would then also etch away a part of the corner of element 120. When the etch step is not fully directional (i.e., isotropic or partially isotropic), etching occurs in the horizontal directional as well, so that cusps can be removed without clipping the corners of the elements. Thus, the range of operating pressures and the power levels used in the etching steps are chosen to satisfy this requirement. For example, unbiased (HF power=0) conditions allow argon to be used; however, with biasing (HF power>0), argon is not used in order to avoid directional sputtering. Wafer temperature can be modulated either by clamping the wafer on the electrostatic chuck (ESC) and cooling the wafer using He or by using a heated ESC.

The deposition and etch steps are preferably carried out in the same process chamber, such as the Novellus SPEED reactor, and transitions from a deposition to an etching step are effected by varying the composition of the mixture, the power supplied to the wafer, the chamber pressure, and/or the temperature of the wafer. Therefore, a higher throughput is possible than with processes using cluster tools, as in the processes described in the articles by Cote et al., Pennington et al. and U.S. Pat. No. 5,270,264, i.e., having separate deposition and etching chambers because the wafer does not need to be transferred back and forth between two separate chambers. Furthermore, the present invention allows a cleaner and more accurate control of the etch step with greater repeatability than other sequential deposition/etching methods, such as disclosed in U.S. Pat. No. 6,030,881 to Papasouliotis et al., which is incorporated by reference. By optimizing the etch/dep ratio and duration of each step, gap-fill capability and throughput can be maximized, and features with aspect ratios approaching and exceeding 3.5:1 and initial opening widths narrower than approximately 0.13 μm can be filled without void formation, even when they are reentrant.

Figure 9:
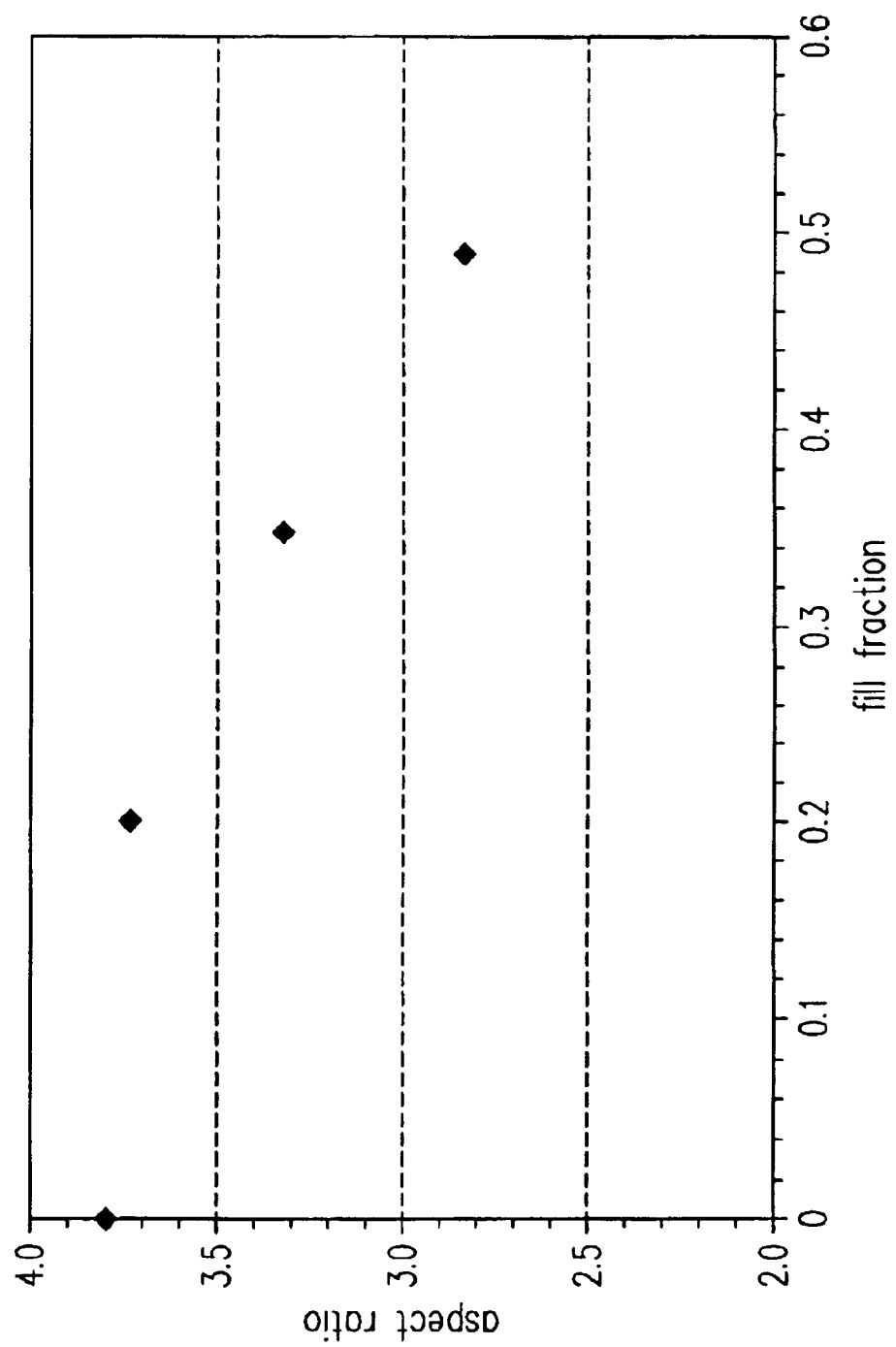
FIG. 9 is a graph showing aspect ratio as a function of the percentage of gap fill.

To illustrate the evolution of a structure as a function of process time and cycles, detailed measurements are given in Table 3 below for a structure of 13000 Å initial spacing and with aspect ratio 4:1. FIG. 9 is a graph showing the reduction of aspect ratio as a function of the percentage of gap fill. As seen from FIG. 9, the aspect ratio of the structure decreases as the gap is filled. After the aspect ratio is reduced to below 3:1, the gap can be fill completely with a final deposition step.

TABLE 3

| | Bottom growth | HDP hat height | Side wall growth | Aspect ratio |
| --- | --- | --- | --- | --- |
| After one etch/dep cycle | 943 Å | 970 Å | 111 Å | 3.74:1 |
| After two etch/dep cycles | 1665 Å | 970 Å | 153 Å | 3.32:1 |
| After three etch/dep cycles | 2358 Å | 970 Å | 277 Å | 2.85:1 |

The above-described embodiments of the present invention are meant to be merely illustrative and not limiting. It will thus be obvious to those skilled in the art that various changes and modifications may be made without departing from this invention in its broader aspects. Therefore, the appended claims encompass all such changes and modifications as fall within the true spirit and scope of this invention.

We claim:

1. A process, in integrated circuit production, for filling a gap having an opening of initial width in the surface of a substrate, comprising:

first depositing a film in said gap using an HDP CVD process having an etch/dep ratio less than one;

stopping said first depositing before said opening closes;

chemically etching said film in said gap with a hydrogen-only plasma;

stopping said etching before corners of elements forming said gap are exposed; and later depositing a film in said gap.

2. The process of claim 1, further comprising applying a high frequency (HF) power to bias said substrate.

3. The process of claim 2, wherein said etching is without argon.

4. The process of claim 1, wherein said substrate is unbiased.

5. The process of claim 1, wherein said depositing is performed with a gas mixture comprising oxygen and silane.

6. The process of claim 5, wherein said gas mixture further comprises an inert gas.

7. The process of claim 1, further comprising repeating one or more cycles of said first depositing and said etching until said gap is filled without leaving a void in said gap.

8. The process of claim 1, wherein said is undoped silica glass.

9. The process of claim 1, wherein said film is doped silica glass.

10. The process of claim 1, wherein said substrate is attached to and heated or cooled by a thermally controllable electrostatic chuck.

11. The process of claim 10, wherein said electrostatic chuck is resistively heated.

12. The process of claim 10, wherein said substrate attached to said electrostatic chuck is cooled with backside flow of helium.

13. The process of claim 1, wherein said chemically etching is in accordance with the reaction $SiO_2 + 2H_2 \rightarrow SiH_4 + O_2$.

14. The process of claim 1 wherein energy for said chemically etching is from a plasma from the HDP CVD process.

15. The process of claim 1, wherein the etch rate for said chemically etching is of the order of 100 Å/min.

16. The process of claim 1, wherein the rate of said chemically etching increases with low frequency power is increased.

17. The process of claim 1, wherein said etching is performed by a non-fully directional etching process.

18. The process of claim 1, wherein said etching is performed in situ.

19. The process of claim 1, wherein said first depositing and said etching are performed in a single process chamber.

20. A process, in integrated circuit production, for depositing an oxide film to fill a gap having an opening of initial width in the surface of a substrate of a less than or equal to about 0.13 microns and a depth, wherein the ratio of said depth to said initial width defines a high aspect ratio of about 3.5:1 or greater, said process comprising:

first depositing an oxide film in said gap using an HDP CVD process having an etch/dep ratio less than one;

stopping said first depositing before said opening is closed;

chemically etching, in situ, said oxide film in said gap with an HDP etching process with a hydrogen-only plasma;

stopping said etching before corners of elements forming said gap are exposed; and later depositing an oxide film in said gap.

21. The process of claim 20, further comprising applying a high frequency (HF) power to bias said substrate.

22. The process of claim 21, wherein said etching is without argon.

23. The process of claim 20, wherein said substrate is unbiased.

24. The process of claim 20, wherein said etching is performed with a non-fully directional etch process.

25. The process of claim 20, wherein said first depositing and said etching are performed in a single process chamber.

26. The process of claim 20, wherein said chemically etching is in accordance with the reaction $SiO_2 + 2H_2 \rightarrow SiH_4 + O_2$.

27. The process of claim 20, wherein energy for said chemically etching is from a plasma from the HDP CVD process.

28. The process of claim 20, wherein the etch rate for said chemically etching is of the order of 100 Å/min.

29. The process of claim 20, wherein the rate of said chemically etching increases when low frequency power is increased.

30. A process for filling a gap having an opening of initial width in the surface of a substrate, comprising:

first depositing an oxide film in said gap using an HDP CVD process having an etch/dep ratio less than one;

stopping said first depositing before said opening closes;

chemically etching said oxide film in said gap with a hydrogen-based plasma;

stopping said etching before corners of elements forming said gap are exposed; and later depositing a film in said gap.

31. The process of claim 30, wherein the oxide film is a doped oxide.

32. The process of claim 30, wherein the oxide film is an undoped oxide.

* * * * *

UNITED STATES PATENT AND TRADEMARK OFFICE
CERTIFICATE OF CORRECTION

PATENT NO. : 6,794,290 B1
DATED : September 21, 2004
INVENTOR(S) : George D. Papasouliotis and Robert D. Tas It is certified that error appears in the above-identified patent and that said Letters Patent is hereby corrected as shown below:

Column 4,
Line 31, delete ">".

Signed and Sealed this

Sixteenth Day of August, 2005

JON W. DUDAS
*Director of the United States Patent and Trademark Office*